(12) United States Patent
Kelly

(10) Patent No.: US 6,197,180 B1
(45) Date of Patent: Mar. 6, 2001

(54) HIGH ASPECT RATIO, MICROSTRUCTURE-COVERED, MACROSCOPIC SURFACES

(75) Inventor: Kevin W. Kelly, Baton Rouge, LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 0 days.

(21) Appl. No.: 09/091,698

(22) PCT Filed: Feb. 5, 1997

(86) PCT No.: PCT/US97/01578

§ 371 Date: Jun. 23, 1998

§ 102(e) Date: Jun. 23, 1998

(87) PCT Pub. No.: WO97/29223

PCT Pub. Date: Aug. 14, 1997

Related U.S. Application Data

(63) Continuation-in-part of application No. 08/599,151, filed on Feb. 9, 1996, now Pat. No. 5,681,661, and a continuation-in-part of application No. 08/757,215, filed on Nov. 27, 1996, now abandoned.

(51) Int. Cl.$^7$ ................................................. C25D 5/02
(52) U.S. Cl. ........................ 205/118; 205/135; 205/136
(58) Field of Search ................................. 205/118, 135, 205/136; 428/156, 172, 134, 137

(56) References Cited

U.S. PATENT DOCUMENTS

| | | | |
|---|---|---|---|
| 3,232,371 | 2/1966 | Reichert et al. | 181/33 |
| 3,598,180 | 8/1971 | Moore, Jr. | 165/133 |
| 3,728,231 | * 4/1973 | Gurev | 204/15 |
| 3,901,770 | 8/1975 | Littwin | 204/15 |

(List continued on next page.)

OTHER PUBLICATIONS

Becker, E.W. et al., "Fabrication of Microstructures with High Aspect Ratios and Great Structural Heights by Synchrotron Radiation Lithography, Galvanoforming, and Plastic Moulding (LIGA Process)," Microelectronic Engineers, vol. 4, pp. 35–56 (1986) no month available.

(List continued on next page.)

Primary Examiner—Edna Wong
(74) Attorney, Agent, or Firm—John H. Runnels

(57) ABSTRACT

The performance of many macroscopic structures (those whose dimensions are on the order of centimeters, meters, or even larger) can be greatly improved by covering their surfaces with microstructures. There are several applications in which "large," microstructure-covered sheets are useful. An apparatus and method are disclosed for forming high aspect ratio microstructures ("HARMs") on planar and non-planar surfaces, using a modification of the LIGA microfabrication process. A free-standing polymer sheet is lithographically patterned with through-holes. The polymer sheet is then pressed against, clamped to, or otherwise attached to a conductive substrate in such a way that the patterned holes in the sheet are not blocked. Subsequent electroplating produces well-defined HARM structures on the planar or non-planar surface, in shapes that are complementary to the lithographically patterned through-holes in the polymer. The polymer may then be removed (e.g., by melting, dissolution, or burning). Various planar and non-planar surfaces have been covered with microstructures. Where the metal surface is non-planar, the polymer sheet may be heated or otherwise made sufficiently flexible to conform to the metal surface, preferably by heat-shrinking to assure firm contact. The process may be used to electroplate microstructures directly onto metal surfaces generally—not just onto metal surfaces that have been specially prepared for LIGA processes, as has previously been the case.

20 Claims, 7 Drawing Sheets

U.S. PATENT DOCUMENTS

| | | | | |
|---|---|---|---|---|
| 3,974,252 | * | 8/1976 | Bischoff, Jr. | 264/299 |
| 4,258,783 | | 3/1981 | Albertson et al. | 165/133 |
| 4,294,669 | * | 10/1981 | Lincoln et al. | 204/15 |
| 4,321,310 | | 3/1982 | Ulion et al. | 428/612 |
| 4,549,606 | | 10/1985 | Sato et al. | 165/179 |
| 4,821,581 | | 4/1989 | Woodward et al. | 181/286 |
| 4,886,572 | | 12/1989 | Kimura et al. | 156/633 |
| 4,921,583 | * | 5/1990 | Sewell et al. | 204/15 |
| 5,045,439 | | 9/1991 | Maner et al. | 430/394 |
| 5,052,476 | | 10/1991 | Sukumoda et al. | 165/133 |
| 5,075,175 | | 12/1991 | Matsui et al. | 428/582 |
| 5,186,252 | | 2/1993 | Nishizawa et al. | 165/181 |
| 5,342,737 | | 8/1994 | Georger, Jr. et al. | 430/324 |
| 5,366,814 | | 11/1994 | Yamanishi et al. | 428/607 |
| 5,378,583 | | 1/1995 | Guckel et al. | 430/325 |
| 5,395,508 | | 3/1995 | Jolly et al. | 205/129 |
| 5,500,666 | * | 3/1996 | Hattori et al. | 347/87 |
| 5,698,485 | * | 12/1997 | Bruck et al. | 501/87 |

OTHER PUBLICATIONS

Diehl, G., "Machinery Sound Control," Machinery Acoustics, pp. 137–147 (1973) * no month available.

Jedlinski, J. "Oxidation–Induced Degradation of Coatings on High Temperature Materials: An Overview," in N. Dahotre et al. (eds.), Elevated Temperature Coatings: Science and Technology I, pp. 75–83 (1995) *no month available.

Jue, J. et al., "Characterization of Yttria and Rare Earth–Oxide Doped Zirconia Materials for High Temperature Applications," in N. Dahotre et al. (eds.) Elevated Temperature Coatings: Science and Technology I, pp. 125–134 (1995) *no month available.

Lau, S. et al., "Degradation Mechanisms of Ceramic Thermal Barrier Caoatings in Corrosive Environments," in S. Singhai (ed.), Conf. Proc. 112th AIME, pp. 305–317 (1983) *no month available.

Rosenau, W. et al., "Fins," Heat, Mass, and Momentum Transfer, pp. 106–109 (1961) *no month available.

* cited by examiner

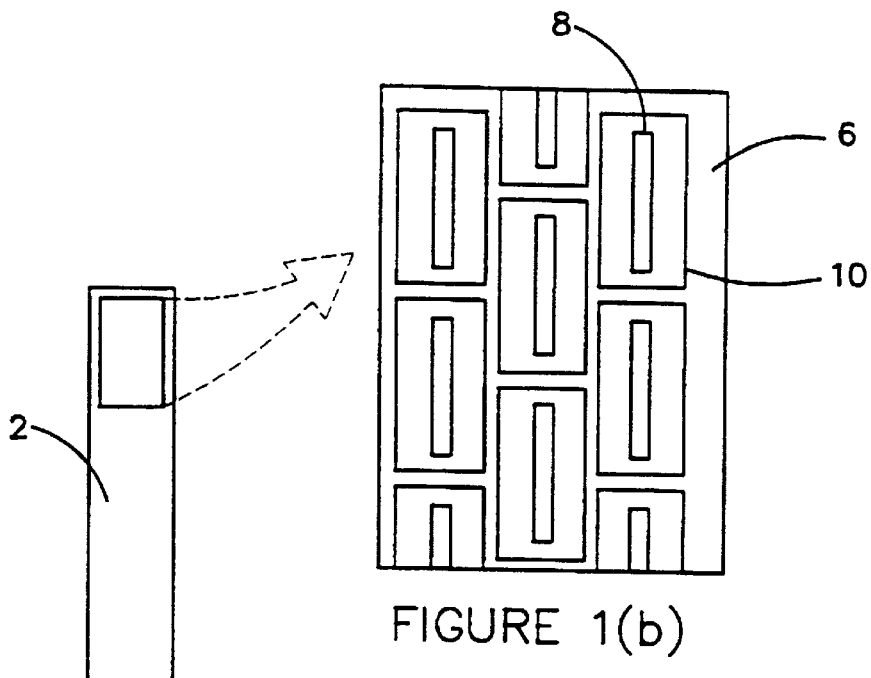
FIGURE 1(b)
FIGURE 1(a)
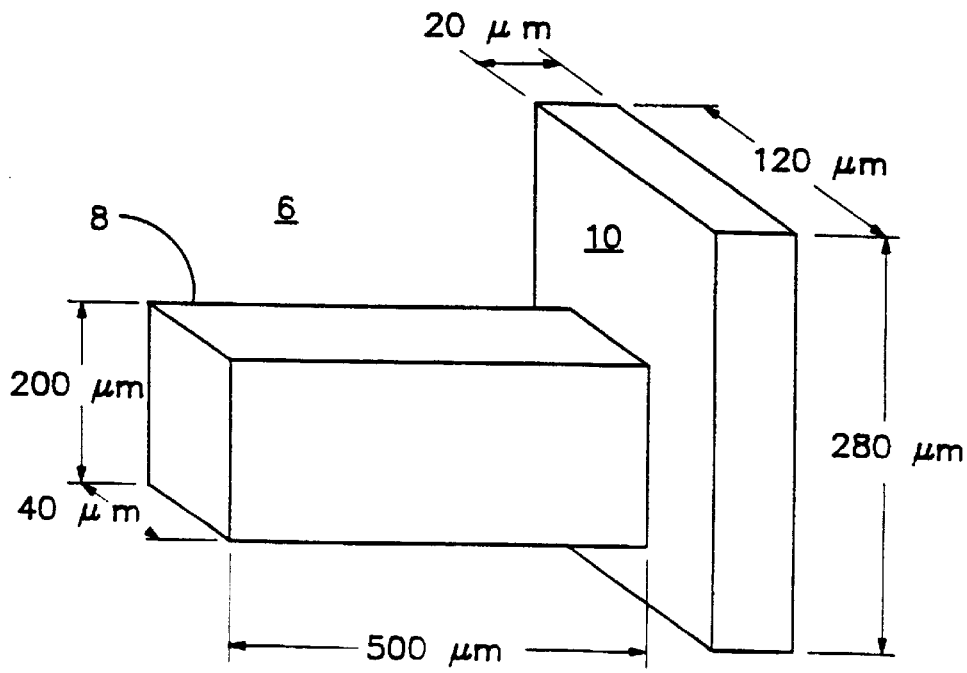
FIGURE 2

HIGH ASPECT RATIO, MICROSTRUCTURE-COVERED, MACROSCOPIC SURFACES

This is the U.S. national stage of International Application PCT/US97/01578, filed Feb. 5, 1997; which is a continuation-in-part of two co-pending applications: (1) Ser. No. 08/599,151, filed Feb. 9, 1996, now U.S. Pat. No. 5,681,661, issued Oct. 28, 1997; and (2) Ser. No. 08/757,215, filed Nov. 27, 1996, now abandoned.

TECHNICAL FIELD

This invention pertains to macroscopic surfaces whose properties are altered by being covered with microstructures, and to an apparatus and method useful in manufacturing such surfaces.

BACKGROUND ART

The properties of many macroscopic structures depend in large part on their surface properties. For example, the rate of heat transfer between a structure and its surroundings depends on the ease with which radiative, conductive, and convective heat transfer occur between the surface of the structure and the surroundings. As another example, the strength of composite materials is often governed by the strength of the bond between the "internal" surfaces joining the different lamina. As yet another example, the rate of activity of a catalytic surface often depends on its surface area.

Efforts have been made to control the interaction of surfaces with their surroundings by painting, roughening, anodizing, hardening, plating, smoothing, and the like. In many cases, the resulting improvements in surface properties are relatively small.

One area where surface effects are important is the operation of gas turbines. The efficiency and power of a turbine increase as the maximum allowable gas inlet temperature increases. This allowable inlet temperature is a function of the composition of the turbine blades, and the balance of various modes of heat transfer into and out of the blade. Internal active cooling of turbine blades (a mode of heat removal), coupled with thermal barrier coatings on their surfaces limiting heat transfer into the blades), allows the blades to operate at a relatively low temperature in an environment hundreds of degrees higher. A reduction in the rate at which heat is transferred from the surrounding combustion gases to the blade would allow operation at higher temperatures and efficiencies.

Both the thermal efficiency and the power output of a turbine rise as the pressure ratio and the accompanying inlet temperature increase. For example, using estimates of turbine performance based on the Brayton cycle and standard cold air assumptions, a turbine receiving air at 300° K with a compressor ratio of 13, and operating at a maximum turbine inlet temperature of 1400° K has a thermal efficiency of 52% and a work output per kilogram of incoming air of 404 kJ/kg. The same turbine, with the same added heat/kg, but at a maximum turbine inlet temperature of 1600° K can operate at a higher pressure ratio, will have a thermal efficiency of 63.5%, and will have work output per kilogram of incoming air of 494 kJ/kg.

Prior thermal barrier coatings (TBCs) have typically consisted of a ceramic thermal insulating layer, such as partially-stabilized zirconia (PSZ), bonded to a superalloy substrate by an oxidation-resistant alloy bond coat, such as NiCrAlY. $ZrO_2$ is usually chosen as the ceramic material because the mismatch between its thermal expansion coefficient ($\alpha$) and that of the metallic Ni-alloy substrate is relatively small. The bond coat serves several purposes: (1) it has an $\alpha$ between that of the substrate and that of PSZ, reducing the effects of $\alpha$ mismatch; (2) it provides oxidation resistance (PSZ is not a good barrier against oxidation); and (3) it promotes adhesion of the PSZ layer. See, e.g., J. Jedlinski, "Oxidation-Induced Degradation of Coatings on High Temperature Materials: An Overview," in N. Dahotre et al. (eds.), *Elevated Temperature Coatings: Science and Technology I*, pp. 75–83 (1995); J. Jue et al., "Characterization of Yttria and Rare Earth-Oxide Doped Zirconia Materials for High Temperature Applications," in N. Dahotre et al. (eds.), *Elevated Temperature Coatings: Science and Technology I*, pp. 125–134 (1995); and S. Lau et al., "Degradation Mechanisms of Ceramic Thermal Barrier Coatings in Corrosive Environments," in S. Singhal (ed.), *Conf. Proc. 112th AIME*, pp. 305–317 (1983).

Prior methods for modifying heat transfer have included radiation heat shields, heat fins, and painted, polished, or roughened surfaces. See, e.g., W. Rosenau et al., "Fins," *Heat, Mass, and Momentum Transfer*, pp. 106–109 (1961). No prior method for optimizing heat transfer between the surface of a structure and its surroundings has used microstructures. As discussed further below, I have discovered a technique for optimizing heat transfer by covering a surface with microstructures.

Prior methods of acoustic dampening have included the use of insulating layers; absorptive baffles; and "active," microprocessor-controlled cancellation of sound through the use of "complementary," out-of-phase sound waves. See, e.g., G. Diehl, "Machinery Sound Control," *Machinery Acoustics*, pp. 137–147 (1973). No prior method of acoustic dampening has used microstructures. As discussed further below, I have discovered a technique for acoustic dampening by covering a surface with microstructures.

No prior work on composite materials has used microstructures to improve bonding between layers of a composite. Prior methods of bonding laminates have generally used chemical bonding techniques. As discussed further below, I have discovered a technique for bonding layers of a laminate by using microstructures at the interface.

The LIGA process for making microstructures is well known in the art. See, e.g., E. Becker et al., "Fabrication of Microstructures with High Aspect Ratios and Great Structural Heights by Synchrotron Radiation Lithography, Galvanoforming, and Plastic Moulding (LIGA Process)," *Microelectronic Engineering*, vol. 4, pp. 35–56 (1986). The conventional LIGA process combines deep-etch X-ray lithography, electrodeposition, and polymer molding. Conventional LIGA is illustrated schematically in FIGS. 4(a) through 4(d). As illustrated in FIG. 4(a), an electrically conductive substrate 102 is glued or chemically bonded to a layer of a photoresist 104 such as polymethyl methacrylate ("PMMA") tens or hundreds of microns thick. The layer of resist is exposed to x-rays 106 through mask 108. Where mask 108 allows radiation 106 to pass, resist 104 degrades and becomes soluble in a developer. After development (FIG. 4(b)) the regions on substrate 102 that are no longer covered with resist 104 serve as initiation sites to electroform metal microstructures 110 (FIG. 4(c)). Following electroforming, removal of the remaining resist 104 produces a substrate covered with free-standing structures (FIG. 4(d)), which may then be used as a mold insert in forming a polymeric microstructure (not illustrated).

Prior work on microstructures (those whose dimensions are smaller than about 1 mm) has focused almost entirely on "microscopic" uses of microstructures. Little consideration has been given to "macroscopic" applications of microstructures, i.e., the use of microstructures to affect the interactions between macroscopic objects and their surroundings. No prior, general methods are known for manufacturing microstructures directly onto a metal surface of interest.

DISCLOSURE OF INVENTION

The performance of many macroscopic structures (those whose dimensions are on the order of centimeters, meters, or even larger) can be greatly improved by covering their surfaces with microstructures.

For example, dissimilar sheets of material that otherwise would not bond well to one another (such as a polymer and a metal) can be more strongly bonded with microstructures extending from one of the sheets and embedded into the other sheet. Such products make valuable laminate composites.

As another example, introducing microstructures to a sheet of material can dramatically change the surface properties of the sheet, such as its surface energy, radiation absorptivity and emissivity, ability to absorb mechanical and acoustic energy, catalytic activity, etc. For example, the rate of heat transfer between an object and the surrounding medium can be dramatically changed by covering the surface of the object with high aspect ratio microstructures, without significantly changing the object's size or weight.

Applying a field of microstructures to a surface of macroscopic dimensions ($cm^2$, $m^2$, tens of $m^2$, or even larger) to alter heat and/or momentum transfer with the surrounding medium has tremendous advantages. For example, assume that a heat shield is needed to reduce the heat flow between a surface and its surroundings. Also assume that the heat shield must be rigidly attached to the surface, that the heat shield will be subjected to large loads, that both the structure and the heat shield undergo large cyclic variations in temperature, and that the weight and dimensional changes introduced by the heat shield should be minimal. Using conventional methods, it is difficult if not impossible to make a heat shield that simultaneously satisfies each of these design considerations. However, a heat shield satisfying each of these criteria may readily be made with a field of microstructures that is attached to the surface or built on the surface.

The size of the thermal boundary layer at a fluid-solid interface is often on the order of hundreds of micrometers. Arrays of microstructures can be built on a surface to effectively trap a layer of stagnant fluid near the surface. The thermal resistance resulting from the stagnant fluid layer is of the same magnitude as the convective resistance. A tremendous increase in thermal resistance results from covering a surface with a canopy of microstructures a few hundred microns from the substrate surface (for example, on the surface of a turbine blade). The individual "umbrellas" in this canopy are more-or-less rigidly connected to the substrate by microposts. The canopy greatly reduces both convective and radiative heat transfer from the surrounding environment to the substrate. Particularly when used in conjunction with internal cooling of the substrate, the temperature of the substrate will be far lower than has previously been possible in otherwise similar environments. For example, as compared to prior thermal barrier coatings, when such microstructures are used to cover turbine blades the turbines can operate at substantially higher temperatures (as much as 290° C. higher than otherwise possible) and substantially higher pressures, while simultaneously reducing thermal stresses. The novel barrier canopies, coupled with state-of-the-art internal cooling systems, will allow operation of turbines having inlet gas temperatures as high as 1427° C. (2600° F.).

An example is an article of manufacture comprising a heat barrier to reduce heat transfer between an object and the surroundings, wherein: (a) the object has a first face whose surface area is at least about 10 $cm^2$; (b) said heat barrier comprises a plurality of at least about 10 microstructures per $cm^2$ of surface area of the first face; (c) each of said microstructures comprises a shield and a post, wherein each of said shields comprises a distal face and a proximal face, and wherein each of said posts comprises a distal end and a proximal end; (d) said distal end of said post of each of said microstructures is connected to said proximal face of said shield of said microstructure; (e) said proximal end of said post of each of said microstructures is connected to the first face of the object; (f) the surface area of the distal face of each of said shields is at least about 0.001 $mm^2$; and (g) the distance between the proximal face of each of said shields and the first face of the object is between about 0.01 mm and about 2.0 mm; whereby total heat transfer between the object and the surroundings is substantially less than would be the heat transfer between an otherwise identical object lacking said heat barrier and the surroundings.

Preferably: said heat barrier comprises a plurality of at least about 5000 microstructures per $cm^2$ of surface area of the first face; (b) the surface area of the distal face of each of said shields is at least about 0.01 $mm^2$; and (c) the distance between the proximal face of each of said shields and the first face of the object is between about 0.1 mm and about 1.0 mm.

In an alternative embodiment, if the "umbrellas" in the canopy are so large that they merge into one another, a continuous wall is formed that is connected to the underlying object by numerous microposts.

An example is an article of manufacture comprising a heat barrier to reduce heat transfer between an object and the surroundings, wherein: (a) the object has a first face whose surface area is at least about 10 $cm^2$; (b) said heat barrier comprises a substantially continuous layer that is substantially parallel to said first face, and that is connected to said first face by a plurality of at least about 10 microstructures per $cm^2$ of surface area of the first face; (c) each of said microstructures comprises a distal end and a proximal end; (d) said distal end of each of said microstructures is connected to said substantially continuous layer; (e) said proximal end of each of said microstructures is connected to the first face of the object; and (f) the distance between said substantially continuous layer and the first face of the object is between about 0.01 mm and about 2.0 mm; whereby total heat transfer between the object and the surroundings is substantially less than would be the heat transfer between an otherwise identical object lacking said heat barrier and the surroundings.

Preferably, the distance between said substantially continuous layer and the first face of the object is between about 0.1 mm and about 1.0 mm.

In another alternative embodiment, no canopies are used in the heat shield; rather, each microstructure forms a wall (or alternatively, a box) substantially perpendicular to the face of the object being shielded, to partially enclose and thereby inhibit convective flow of the fluid near the face. The wall is preferably at least about 0.5 mm tall in the direction perpendicular to the face, more preferably about 1.0 mm;

and the interior of the region bounded by the wall and capable of partially enclosing the fluid preferably has a width of 10–50 μm, preferably about 20 μm, and a height/cavity width ratio between 5 and 100, preferably between 10 and 20. (The "cavity width" is the distance between adjacent walls.)

An example is an article of manufacture comprising a heat barrier to reduce heat transfer between an object and the surroundings, wherein: (a) the object has a face whose surface area is at least about 10 $cm^2$; (b) said heat barrier comprises a plurality of at least about 10 microstructures connected to said first face, wherein adjacent microstructures are spaced between about 10 μm and about 500 μm apart from one another; and (c) each of said microstructures comprises a wall substantially perpendicular to said face, to partially enclose and thereby inhibit heat transfer near said face, wherein said wall is at least about 0.1 mm tall in the direction perpendicular to said face, and wherein the height of said microstructures is at least about 5 times the distance between adjacent microstructures; whereby total heat transfer between the object and the surroundings is substantially less than would be the heat transfer between an otherwise identical object lacking said heat barrier and the surroundings.

Preferably, adjacent microstructures are spaced between about 20 μm and about 50 μm apart from one another, the wall is at least about 0.5 mm tall in the direction perpendicular to said face, and the height of the microstructures is at least about 10 times the distance between adjacent microstructures.

The novel thermal barrier has significantly higher resistance to heat transfer than do existing film coatings such as those made of zirconium dioxide. The novel thermal barrier also greatly reduces the thermal stresses that can otherwise occur at the substrate-coating interface as a result of thermal expansion coefficient mismatch during thermal cycling.

Yet another application is the use of microstructures as acoustic absorbers, to reduce the amplitude of sound transmitted through a surface. Covering the surface with appropriate microstructures can reduce the amplitude of transmitted vibrations, and can therefore reduce the amplitude of the sound transmitted to the surrounding medium. Also, catalytic surface performance might be enhanced by the presence of microstructures on the surface due to the increase in area available for reaction.

It has been discovered that the performance of many macroscopic structures (those whose dimensions are on the order of centimeters, meters, or even larger) can be greatly improved by covering their surfaces with microstructures. In addition, a novel apparatus and method have been discovered for forming high aspect ratio microstructures ("HARMs") on planar and non-planar surfaces, using a modification of the LIGA microfabrication process. A free-standing, non-conductive sheet (e.g., a polymer or ceramic sheet) is patterned lithographically or by LIGA with through-holes. The non-conductive sheet is then pressed against, clamped to, or otherwise attached to a conductive substrate in such a way that the patterned holes in the sheet are not blocked. Subsequent electroplating produces well-defined HARM structures on the planar or non-planar surface, in shapes that are complementary to the lithographically patterned through-holes in the non-conductive sheet. The sheet may then be removed (e.g., by melting, dissolution, or burning).

Various planar and non-planar surfaces have been covered with microstructures through the new technique. Where the metal surface is non-planar, a polymer sheet may be heated or otherwise made sufficiently flexible to conform to the metal surface, preferably by heat-shrinking to assure firm contact.

The novel process may be used to electroplate microstructures directly onto metal surfaces generally—not just onto metal surfaces that have been specially prepared for LIGA processes, as has previously been the case.

The through-holes may have lateral dimensions (i.e., dimensions parallel to the surface of the sheet) between 1 μm and 500 μm. The holes may have essentially any desired cross-section and need not, for example, have a circular cross-section. Thus sheets may be formed having holes that could not be formed by conventional drilling with a rotating bit.

The holes may pass vertically through the sheet, or they may be slanted, or even tapered. For many applications the holes are preferably "straight." As used in the specification and the claims, a hole in a sheet is considered to be "straight" if each point on the periphery of the hole on one surface of the sheet may be connected to at least one point on the periphery of the hole on the opposite surface of the sheet by a line that lies entirely on the inner surface of the hole, and that is geometrically straight within a precision of ±1 μm. Note that the following shapes, as a few of the essentially innumerable possible examples, are considered "straight" within this definition, even though they may also include curved surfaces: a right-circular cylinder, an elliptical cylinder, an irregular cylinder, the frustum of a cone, and a cylinder or cone frustum whose axis is not perpendicular to the surface of the sheet.

Distinctions of the novel process from any previously reported LIGA process include the following: (1) The scale of the surface covered with microstructures may be very large—tens of centimeters, meters, tens of meters, or larger; and (2) Unlike conventional LIGA, in which the resist is glued or chemically bonded to the metal electroplating surface, in the novel process the non-conductive sheet with high aspect ratio through-holes need not be glued to the metal electroplating surface, and preferably is not glued to that surface.

For example, at least some of the holes in the non-conductive sheet may have an aspect ratio greater than about 5.

An alternate method to mass-produce HARM-covered components is to produce first a roller coated with HARMs. Such a roller may then be used in a mass-production embossing process.

The non-conductive template should preferably be self-supporting (such as the one illustrated in FIG. 6, produced using a wire screen mesh mask). I.e., the pattern of holes in the developed template should not leave developed areas in the template isolated from one another, or with weak spots that would cause the template to fall apart when manipulated.

A modification to this process may be used in a case where the developed template would not be self-supporting. In this case, the PMMA (or other resist) is exposed to x-rays, and is glued to the substrate while still undeveloped, for example with methyl methacrylate hardened to PMMA or with cyanoacrylate. The template is then developed under conditions that will not remove the glue bonding the remaining high-molecular weight template to the substrate. The glue from the exposed and developed areas is then extracted with a solvent under conditions that will not significantly remove glue that is bonding the remaining high-molecular weight template to the substrate. The development of the template and the partial extraction of glue may, depending on the geometry of a particular pattern, be performed as a single step. For example, the monomer methylmethacrylate may be used as the glue. The monomer will be dissolved in the same solvent that is used to develop the exposed PMMA, but under conditions of time and temperature that will not significantly "undermine" the monomer that adheres the high molecular weight PMMA to the substrate. In a related modification, a developed template is applied in lieu of this undeveloped template, but a thin backing remains in the developed areas when the template is glued to the substrate. The thin backing is then removed, for example by chemical or radiation-induced etching. A template with such a thin backing could be formed, for example, by a molding process.

BRIEF DESCRIPTION OF THE DRAWINGS

FIGS. 1(a) and 1(b) illustrate schematically an embodiment of a turbine blade covered with microstructures that may be manufactured through the use of the present invention.

FIG. 2 illustrates a preferred geometry for microstructures used to cover a turbine blade.

MODES FOR CARRYING OUT THE INVENTION

EXAMPLE 1

Manufacturing microstructures on a nickel surface

For example, as a prototype our research group has successfully electroplated 1000 $\mu$m-tall nickel HARMs over an area approximately 2.5 cm×2.5 cm with the novel process. The original mask was a stainless steel wire screen, which was used to lithographically pattern a free standing 1000 $\mu$m thick sheet of PMMA using the synchrotron radiation source at the Louisiana State University Center for Advanced Microstructures and Devices ("CAMD"). The wire-to-wire spacing of the screen mask was 290 $\mu$m, and the diameter of the individual wires was 125 $\mu$m.

Figure 7:
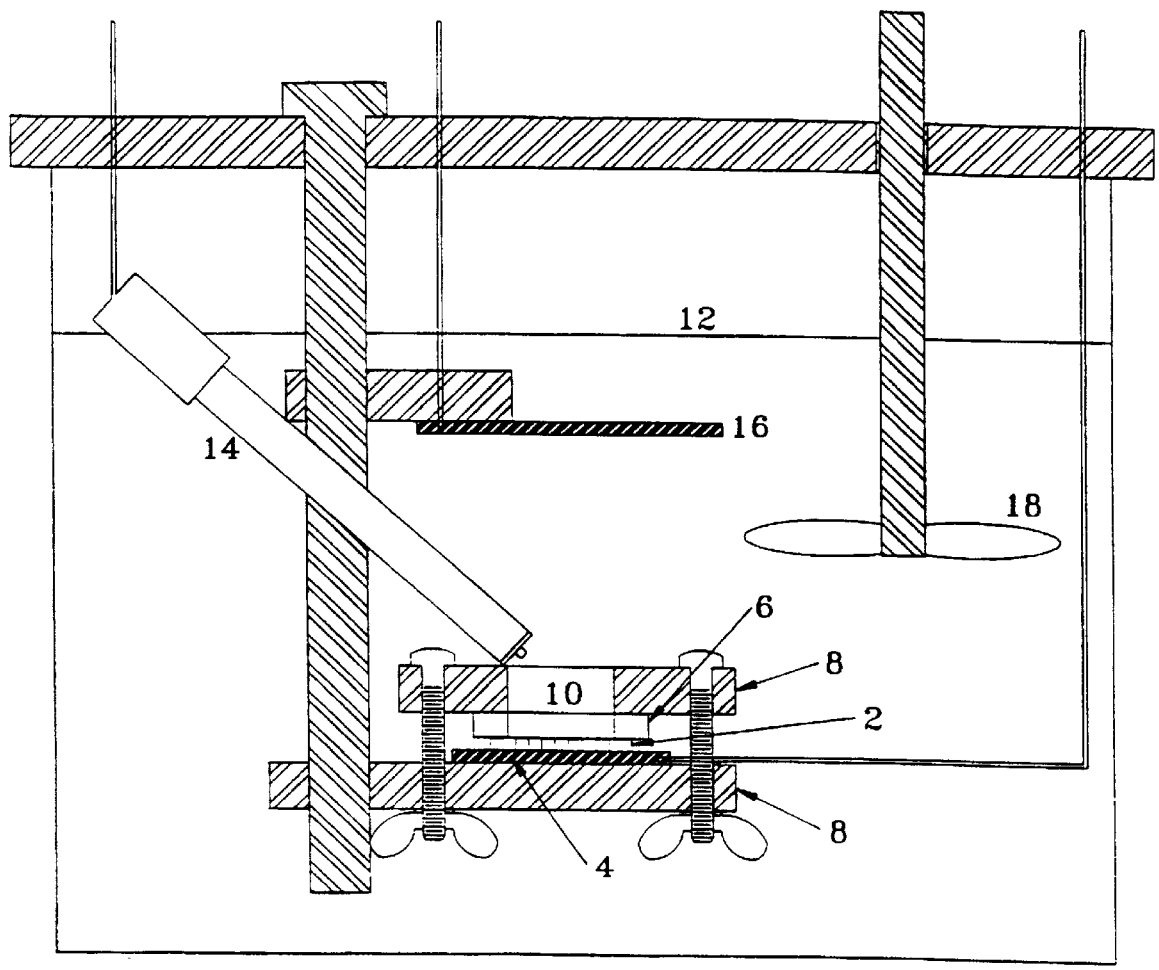
FIG. 7 schematically depicts electroplating apparatus used to manufacture one embodiment of microstructures on a nickel surface in accordance with the present invention.

The electroplating apparatus is illustrated in FIG. 7. The developed PMMA 2 was placed on 5.0 cm×5.0 cm×1.0 mm nickel sheet 4. Nickel sheet 4 was coated with insulating tape (not illustrated), everywhere except where it contacted PMMA sheet 2. Rubber gasket 6 was placed on top of PMMA sheet 2. Nickel sheet 4, lithographically patterned PMMA sheet 2, and rubber gasket 6 were then clamped between two 1.0 cm-thick Plexiglas plates. To allow the plating solution to reach the nickel surface, four square holes 10 (each 1.0 cm×1.0 cm) were machined in both the upper plexiglass plate 8 and in rubber gasket 6 prior to clamping, and the holes in the plate and the gasket were carefully alignedduring clamping.

The assembly was immersed in filtered nickel electroplating bath 12 at 55° C., with PMMA resist 2 oriented horizontally above nickel sheet 4. Reference electrode 14 was positioned as close as possible to nickel sheet cathode 4. Nickel anode 16 was positioned horizontally 7 cm above cathode 4. The electroplating process was potentiostatically controlled to produce a deposition rate of approximately 80 $\mu$m/hour in a solution continuously stirred with propeller 18.

Once electroplating was complete, the PMMA was removed by dissolution in acetone, leaving a field of square nickel posts. Of particular interest was that negligible underplating of the PMMA template was observed; the interface between the posts and the nickel sheet was well defined.

EXAMPLE 2

HARMs Fabricated on a Cylindrical Shaft

The novel process has been used to fabricate HARMs on a nickel cylinder of diameter 1.0 cm. A square-grid mask was used to lithographically pattern a free-standing sheet of PMMA of thickness 300 $\mu$m using the CAMD synchrotron x-ray radiation source. The nickel cylinder was placed vertically on a hot plate and brought to a temperature of approximately 100° C. The exposed PMMA sheet was held above the same hot plate until it became flexible, at which point it was wrapped around the cylinder and secured with a clamp. The cylinder was removed from the hot plate and cooled to room temperature. Because the thermal expansion coefficient of PMMA is greater than that of nickel, the PMMA shrink-fit onto the nickel cylinder.

The PMMA was then developed by immersing the PMMA-coated nickel cylinder into GG developer (V. Ghica and W. Glashauser, "Verfahren für die Spannansfreie Entwicklung von Bestrahlten Polymethyl-methacrylat-Schichtyen," Offenlegungsschrift DE3039110, Siemens AG, Mjinchen, Germany), producing a field of square through-holes in the PMMA. Electroplating was then used to fill the square through-holes in the PMMA with nickel. The PMMA was removed with acetone, resulting in a cylinder covered with microscopic square posts.

On a flat substrate, conventional LIGA produces structures with lateral dimensions that are constant to submicron accuracy. On a non-planar surface, the novel process can produce structures whose lateral dimensions may vary. For example, the width of the microstructures on the cylindrical shaft described above increases with the distance from the underlying substrate. However, if the radius of the cylinder is large compared to the thickness of the PMMA template used to define the shapes of the microstructures, then the distortion in the shapes of the microstructures will be minimal. For example, if the roller diameter is 5.0 cm, the nominal lateral dimension of a microstructure is 100 $\mu$m, and the thickness of the polymer template is 500 $\mu$m, then the lateral dimension of the structures will vary from 99.5 $\mu$m at the base to 100.5 $\mu$m at the top. In many applications, a deviation of this magnitude is negligible.

A HARM-covered cylinder such as that described above could be used in a rolling operation to produce HARM-covered sheet in a mass-production embossing process.

EXAMPLE 3

Thermal banners; application to turbine blades

In one embodiment, thermal barrier microstructures will be manufactured on a turbine blade. A mold insert will be manufactured to mold or emboss a pattern of microstructures into a thin film of polymer as described above. The polymer film, containing voids where structures in the mold insert were present, is applied to the blade surface. An electroplating process then fills voids in the polymer with metal, thereby building a field of microstructures on the blade surface. By overplating beyond the height of the polymer, caps can be grown on top of the posts if desired; if the caps are allowed to grow large enough, they can form a continuous wall connected to the substrate by numerous microposts. Following the electroplating process, the polymer film is removed, for example with a solvent, leaving a metallic microstructure canopy on the surface.

It is preferred that there be a smooth transition from a material at the base of the microstructures whose composition is identical to that of the substrate, for example a nickel alloy, to a very high temperature, oxidation-resistant material at the top of the microstructures, such as $Al_2O_3$, a NiCrAl alloy, or a NiCrAlY alloy. This smooth transition is achieved by gradually changing the concentrations of the ions in the electroplating solution.

As compared to prior thermal barrier coatings, the new design has major advantages, including the following: A typical 100 $\mu$m PSZ coating provides relatively little resistance to heat transfer, and allows a turbine gas temperature increase of several tens of degrees. By contrast, the new design allows an increase in inlet gas temperature of around 290° C. or even more. A thermal barrier coating formed from PSZ has a low strain tolerance, low bond strength, and low thermochemical stability. The density of point defects in PSZ does not allow the inward diffusion of cations or anions needed to form a protective oxide layer. Many stress-induced small cracks are typically present in a PSZ coating. Oxidation of the bond coat occurs, forming an $Al_2O_3$ layer at the interface between NiCrAlY and PSZ, leading to further differences in $\alpha$ at the interface and to PSZ spalling induced by thermal cycling. By contrast, the novel design does not require $ZrO_2$ or any other thermal barrier coating. Likewise, the problem of $\alpha$ mismatch between a continuous thermal insulating layer and the substrate no longer exists. The individual microstructures are flexible, and the microstructures as a group are discontinuous. The effect of any thermal mismatches will be negligible because of the small size of the microstructures.

An embodiment of a turbine blade in accordance with the present invention is illustrated schematically in FIGS. 1(a) and 1(b). Turbine blade 2, made of a high temperature, high strength nickel alloy (such as a high-temperature NiCo alloy) is 0.3 meters in length (R). Blade 2 and shaft 4 are assumed to rotate at 30,000 rev/min. The environment in which the blade operates is assumed to be air at a temperature of 1700° K and a pressure of 500 kPa (~5 atmospheres). Blade 2 is cooled internally through means known in the art (not illustrated).

The surface of blade 2 is covered with microstructures 6 whose shape is generally as illustrated in FIG. 1(b). Each microstructure comprises a rectangular column 8 oriented normal to the blade surface and capped by a rectangular plate 10. A preferred geometry for microstructures 6 is illustrated in FIG. 2. Note that the length dimension of each column 8 is oriented parallel to the length of blade 2. The stresses in the microstructure reach a maximum at the base of the microstructures that are near the tip of the blade, where centripetal forces are greatest.

With a blade length of 0.3 meter and a rotational velocity of 30,000 rpm, the acceleration at the tip of the blade is $\alpha=2.96\times10^6$ m$^2$/sec. The force per unit length p applied to the structure is p=$\rho$hwa, where $\rho$ is the density of the material (for nickel, $\rho$=8000 kg/m$^3$), h is the height of the cantilever (assumed to be 500 $\mu$m), and w is the cantilever width (assumed to be 40 $\mu$m), giving a value of p=189 N/m.

The maximum moment within the cantilever beam occurs at its base. The magnitude of the moment is M=0.5 pL$^2$, where L is the length of the cantilever (assumed to be 500 $\mu$m). The moment at the base of the cantilever is 2.36×10$^{-5}$ N-m. The moment at the base of the cantilever is used to calculate the maximum stress in the beam: $\sigma_1$=Mc/I, where $\sigma_1$ is the stress due to the distributed load of the beam, c is the distance from the neutral axis (h/2), and I is the moment of inertia (h$^3$b/12). The maximum stress due to the distributed load occurs at the base of the cantilever beam, and has a magnitude of 8.85×10$^7$ N/m$^2$ (=12.8×10$^3$ psi=12.8 ksi).

A similar analysis can be used to estimate the contribution of the mass on the end of the cantilever to the total stress. In this case, the moment induced at the base of the cantilever by the mass is equal to the product of the force due to that mass (i.e., the mass multiplied by the centripetal acceleration) and the length of the cantilever beam. The stress induced by the "weight" at the end of the beam is $\sigma_2$=Mc/I. The magnitude of this second stress component is 4.3 ksi. The sum of the two components gives the maximum stress in the microstructure, approximately 17.1 ksi. This maximum stress is low enough to conclude that creep-induced deformation should not be a significant problem over reasonable operational time spans. Similarly, the maximum deflection of the end of the cantilever beam is low, and can be calculated by superposition to be less than 1.0 micron.

Figure 3A:
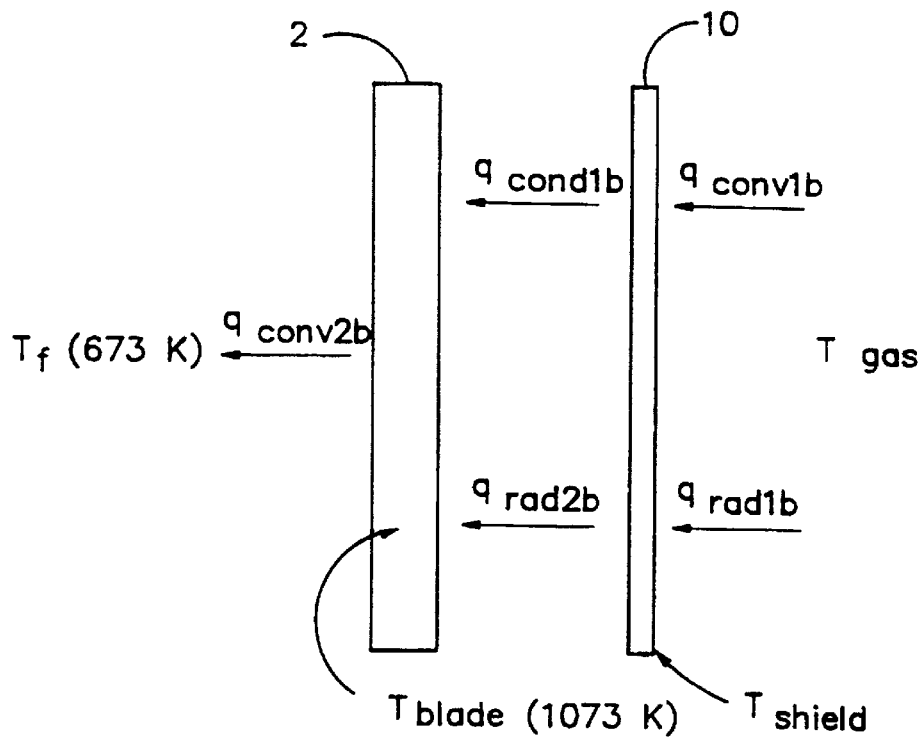
FIGS. 3(a) and 3(b) illustrate heat flow through a surface with and without a microstructure canopy, respectively.
Figure 3B:
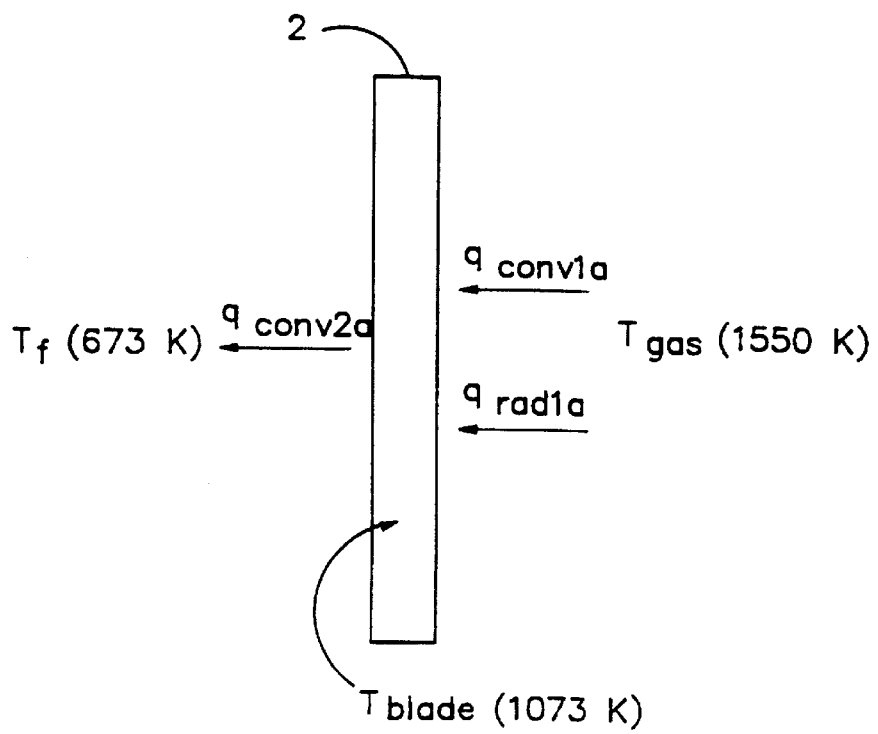
Figure 4A:
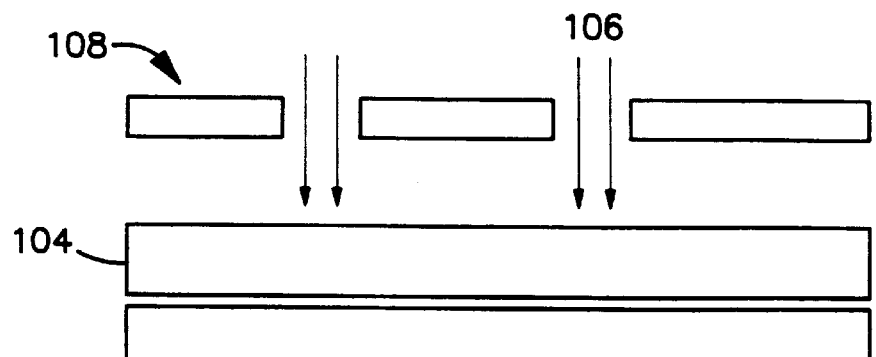
FIGS. 4(a) through 4(d) schematically illustrate the LIGA process.
Figure 4B:
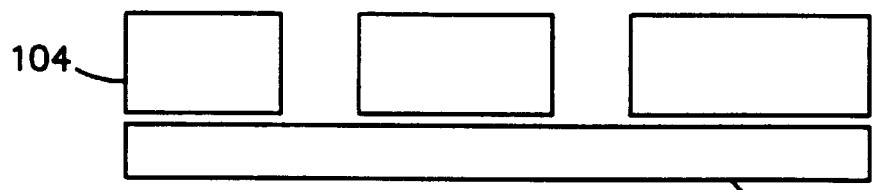
Figure 4C:
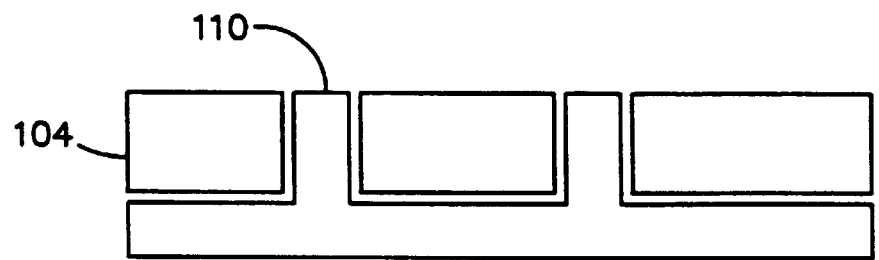
Figure 4D:
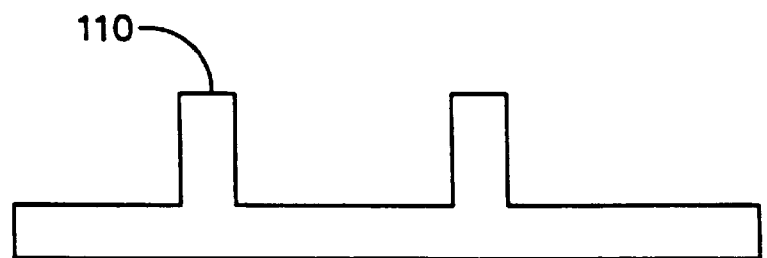

The thermal resistance added by covering the blade with a microstructure canopy is substantial. FIGS. 3(a) and 3(b) illustrate heat flow with and without the microstructure canopy, respectively. In both cases, the heat flux from the surroundings to the blade is removed by internal cooling passages (not illustrated). In both cases, the blade temperature is assumed to be maintained at 800° C.=1073° K. The dependent (or limiting) variable in the case without microstructures is the heat transfer coefficient to the internal cooling medium. In the case with microstructures, the dependent (or limiting) variable is the allowable temperature of the turbine gas.

Analysis without microstructure canopy. Heat transfer between the blade and the surroundings occurs both by convection and by radiation ($q_{conv1a}$ and $q_{rad1a}$). The blade is maintained at 1073° K (800° C.) by convective heat transfer ($q_{conv2a}$) to a fluid at 673° K (400° C.). Convective heat transfer from the surrounding medium to the blade is q=h$\Delta$T, where q is the heat flux, h is the convective heat transfer coefficient, and $\Delta$T is the temperature difference between the plate and the freestream of the fluid.

The value of the convective heat transfer coefficient, h, may be approximated as $h_{conv1a}$=(K/L) (0.037 ($V_\infty$L/v)$^{0.8}$−871) (Pr)$^{1/3}$ where K is the thermal conductivity of air (0.0891 W/m-K), L is the length of the plate (assumed to be 0.05 m), $V_\infty$ is the freestream velocity (assumed to be 942 m/sec), v is the dynamic viscosity of the fluid (assumed to be 40×10$^{-6}$ m$^2$/sec), and Pr is the Prandtl number of the fluid (assumed to be 0.705). The fluid properties used are those of air at 1400° K (the film temperature) and 500 kPa. The freestream velocity is the tip speed of the blade, and the length L is the blade width. With these assumptions the value of $h_{conv1a}$ is 2836 W/m²-°K=0.2836 W/cm²-°K, and the heat flux to the plate from the surrounding air by convective heat transfer, $q_{conv1a}$, is $1.35\times10^6$ W/m², or 135 W/cm².

Assuming that both the blade and the gas act as blackbody emitters, radiative heat transfer to the blade is $$q_{rad1a}=\sigma(T_{gas}^4-T_{blade}^4)$$

where $\sigma$ is the Stephan-Boltzmann Constant ($5.88\times10^{-12}$ W/cm²-°K). The radiative heat flux to the blade is thus 25 W/cm², and the total heat flux across the blade ($q_{total}=q_{conv1a}+q_{rad1a}$) is 160 W/cm². This heat is removed by fluid forced through internal ducts within the blade. The magnitude of the heat transfer coefficient, $h_{conv1a}$, is given by $h_{conv2a}=q_{total}/(T_{blade}-T_{gas})$. The calculated magnitude of $h_{conv2a}$ is then 0.40 W/cm²-°K.

Analysis with microstructure canopy. In this analysis the temperature of the blade is held at 1073° K as before, and the parameters associated with internal cooling are assumed to be the same. With the same parameters, it follows that the heat flux across the blade is the same as calculated in the previous section (160 W/cm²). This heat flux value then allows calculation of the maximum allowable turbine gas temperature and the corresponding shield temperature for the case where microstructures are present. The maximum allowable temperature of the gas and the shield is estimated by assuming radiative heat transfer to be linear, and by evaluating the relative magnitudes of the linear thermal resistances between the temperatures of interest ($T_{gas}$, $T_{shield}$, and $T_{blade}$). The following two additional assumptions are also made: (1) All emissivities have a value of 1.0. (2) The array of microstructures forms a radiation shield. Heat transfer between the shield and the blade occurs by conductive and radiative heat transfer only. Radiative heat transfer is calculated based on the area of the surface not occupied by the support structures (the rectangular posts in the embodiment of FIGS. 1 and 2). Conductive heat transfer is calculated based on the percentage of the total cross sectional area occupied by the support structure. The velocity of the gas in the space between the shield and the blade is minimal, and convective heat transfer may therefore be disregarded.

Heat transfer between the shield and the blade surface is the sum of the conductive and radiative heat transfer components:

$$q_{cond1b}=(A_m/A_t)(K_m/L)(T_{shield}-T_{blade})$$
$$q_{rad2b}=h_{rad2b}(1-A_m/A_t)(T_{shield}-T_{blade})$$
$$h_{rad2b}=4\sigma T_{m2}^3$$

where $T_{m2}=(T_{shield}+T_{blade})/2$; $A_m$=area of microstructure support (approximately 10% of total); $A_t$=total area of shield; $K_m$ is the thermal conductivity of the support structure (0.20 W/cm-°K); and L is the height of the microstructures ($500\times10^{-4}$ cm). Knowing the total heat flux between the shield and the blade (160 W/cm²) and the blade temperature (1073° K), the temperature of the shield may be found, by iterating the following equations, to be 1440° K.

$$q_{cond1b}+q_{rad2b}=(T_{shield}-T_{blade})/R_2=160 \ W/cm^2$$

$$1/R_2=(1-A_m/A_t)h_{rad2b}+(A_m/A_t)(K_m/L)$$

The heat transfer between the gas and the shield is the sum of convective and radiative heat transfer. The following equations give these two components, and the linearized radiative heat transfer coefficient:

$$q_{conv1b}=h_{conv1b}(T_{gas}-T_{shield})$$
$$q_{rad1b}=h_{rad1b}(T_{gas}-T_{shield})$$
$$h_{rad1b}=4\sigma T_{ml}^3$$

where $T_{ml}=(T_{gas}+T_{shield})/2$

Knowing the value of the total heat flux between the gas and the shield (160 W/cm²) and the shield temperature (1440° K), the maximum allowable gas temperature is calculated iteratively using the equations below, and found to have a value of 1850° K. The convective heat transfer coefficient, $h_{conv1b}$, is equal to the value calculated above for the zone between the air and the blade.

$$q_{conv1b}+q_{rad1b}=(T_{gas}-T_{shield})/R_1$$
$$R_1=1(h_{rad1b}+h_{conv1b})$$

The addition of the microstructure shield allows a remarkable 290° K increase in the turbine gas temperature with the same blade temperature.

A similar analysis shows that for a given inlet turbine gas temperature, the blade temperature will decrease 150–175° K with the microstructure canopy. The novel microstructure thermal barrier coating has tremendous potential.

Manufacture of Microstructure-Covered Blades. The manufacturing techniques described here for thermal barriers may be applied generally to other microstructure-covered surfaces as well, such as those used in augmenting heat transfer, in composite materials, and in acoustic barriers (although the use of heat-resistant materials may not be necessary in all applications). Thin sheets of polymer film will be used to manufacture large fields of HARM through holes.

Exposing a large area of resist in a single exposure (on the order of 10 cm×10 cm) is more efficient than exposing an equal area in a series of exposures of smaller areas, because the rate of production during molding is proportional to the size of the mold. Larger mold inserts are more easily manufactured from larger regions of patterned resist. To expose such large areas of resist, the resist typically must be moved relative to the x-ray beamline. Two approaches may be used to expose large areas of resist. If the area of the mask pattern is small relative to the area of resist to be exposed, then the resist is moved with respect to the mask (or vice versa) through a series of accurately calibrated "steps" through means known in the art. On the other hand, if the area of the pattern on the mask is the same as the area of resist to be exposed, then the mask and resist can be moved in tandem relative to the beamline.

Several methods may be used to reproduce HARMs efficiently from template or mold inserts. The advantages gained by exposing a large area of resist can be significant. However, where fields of microstructures must cover areas on the order of hundreds of cm² or even m², it is impractical to manufacture the material using only a lithography electroplating process. In such cases, it may be more practical to repeatedly reproduce a relatively small pattern from a mold insert. The mold insert is used in a polymer molding process to fabricate polymer sheets containing voids where the structures were present in the insert, and vice versa. The polymer sheets are then bonded to a conductive surface (e.g., a turbine blade), and microstructures are electroplated in the voids in the polymer film. The polymer is then removed after the electroplating process is completed, e.g., by dissolution in solvent.

Figure 5A:
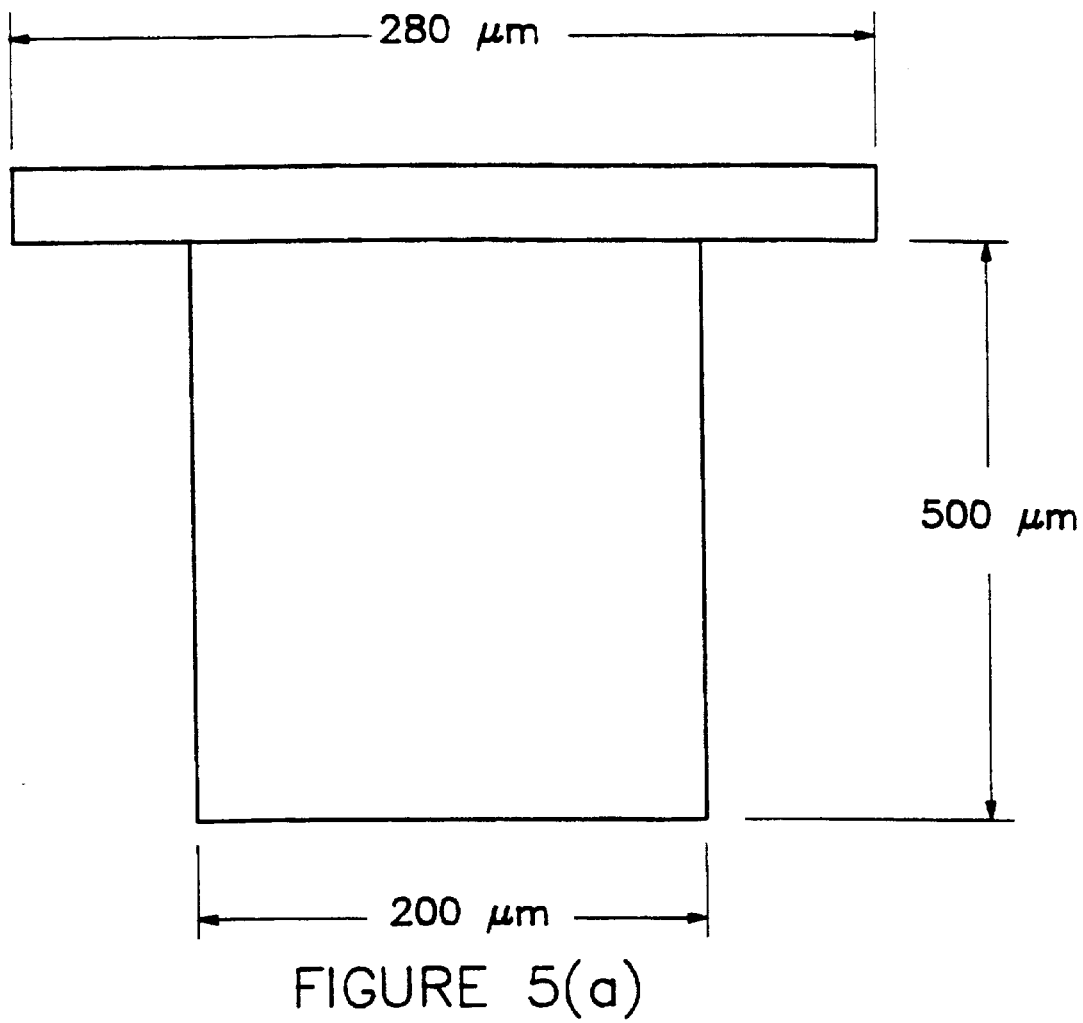
FIGS. 5(a) and 5(b) illustrate cross sections of microstructures used in a thermal barrier covered with microstructures, that may be manufactured through the use of the present invention.
Figure 5B:
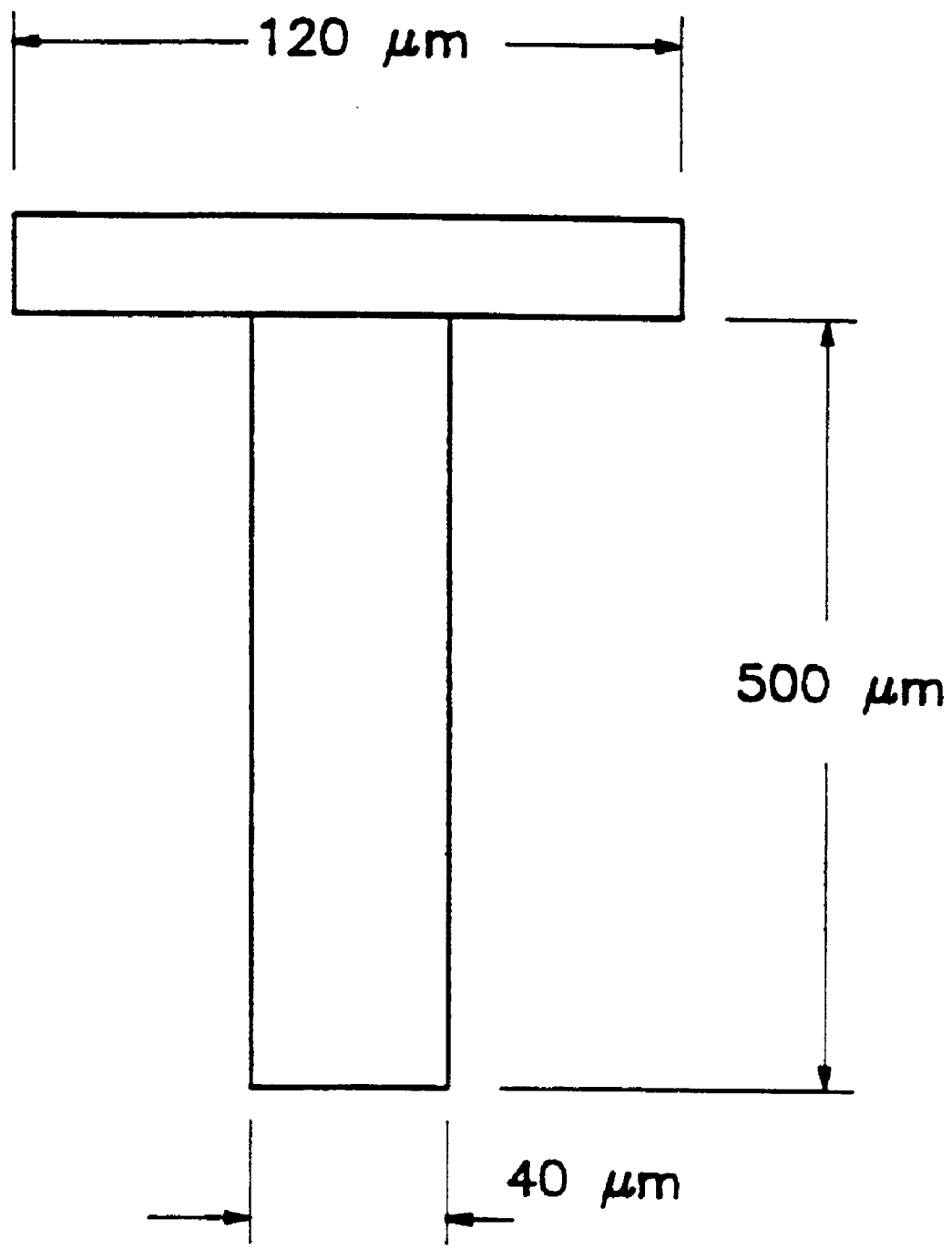
Figure 6:
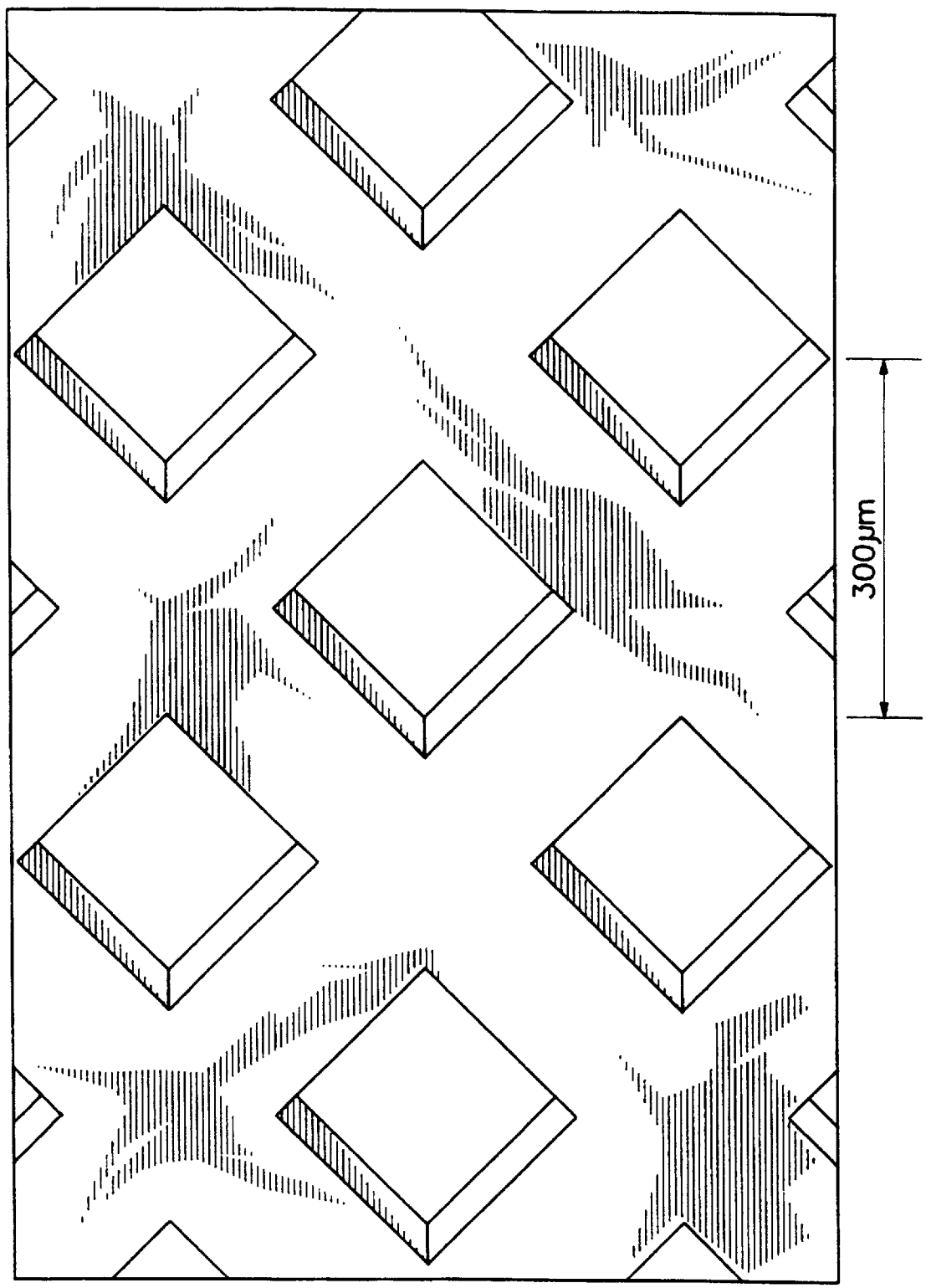
FIG. 6 is a drawing of a photograph of a non-conductive, self-supporting template in accordance with the present invention.

For example, polymer sheets containing fields of microstructures having the cross sections in perpendicular directions shown in FIGS. 5(a) and 5(b) will be produced. A ten μm gap between adjacent canopies in all directions will allow more than ample room for thermal expansion. The PMMA sheets will be shrink-fit or clamped onto a turbine blade. Alternatively, the PMMA sheets will be glued onto a turbine blade with the monomer methyl methacrylate. The monomer may extrude through the holes of the polymer sheet, but can easily be removed with a solvent (e.g., the same solvent used as the developer). Once the sheet is attached to the blade, and the holes are cleared of monomer (if any), the blades are dipped into an electrolytic bath and structures of selected composition are grown.

Materials Aspects. Proper materials selection is necessary to optimize the performance and integrity of the new thermal barrier shield at service temperatures. Qualitatively, the materials requirements for the blade may be less demanding, because the temperature of the blade can be substantially lower than would otherwise be the case, all else being equal. The materials requirements of the microstructure tips are more demanding, in that they must be able to sustain temperatures of 1200–1300° K; on the other hand the stress carried by the tips is relatively low. Moderate degradation of mechanical properties at the high-temperature end (the shield plate) can be tolerated, because the magnitude of stress at that end of the plate is low. Higher stress at the interface with the blade may also be tolerated because the temperatures at that end are lower.

Ni superalloys are good high-temperature materials. To protect the blade, Ni—Cr based alloy posts, which can for example be prepared by electroplating techniques known in the art, will be built on the blade surface. It is preferred to create a Cr concentration gradient in the microstructures, such that near the interface with the blade surface the deposit is Ni-rich, while the shield plate is Cr-rich. The posts can then be oxidized, producing a $Cr_2O_3$ shield. ($Cr_2O_3$ is known to be one of the best thermal protective barriers. Other thermal protective barrier compositions include $Al_2O_3$ and $SiO_2$.) Composition variation during electroplating is performed through means known in the art by appropriate control of parameters such as ion concentration, current density, pH, and deposition potential. Such a "functionally gradient material" will have improved mechanical, adhesion, and oxidation resistance properties. A high Cr content at the shield plate will form a continuous chromina coating acting as a barrier against oxidative degradation. The Ni-rich end resembles the substrate to minimize thermal mismatch and adhesion problems.

Above 1273° K, $Cr_2O_3$ may be oxidized to $CrO_3$, which is a volatile compound. However, the higher end of the projected service temperature range is above 1273° K. A Ni—Cr alloy may therefore not suffice in all applications. Alternative alloys for use at higher temperatures include electroformed Ni—Al binary alloy, Ni—Cr—Al ternary alloy, and Ni—Cr—Al—Y alloy. These coatings rely on a continuous $Al_2O_3$ scale for oxidation resistance. Such a scale is known to form on nickel aluminides, NiCrAlY, and CoCrAl coatings. The scale is an effective oxidation barrier over the temperature range 1100° K to 1400° K. $Ni_xAl_{l-x}$ and Al—Cr may be co-deposited from non-aqueous baths. See, e.g., T. Moffat, J. Electrochem. Soc., vol. 141, pp. 3059 ff (1994). Co-electrodeposition of Y with the transition metals will be performed with methods analogous to those used in S. Powers et al., Materials Chem. & Phys., vol. 35, pp 86 ff (1993). Another alternative is to deposit individual layers of elemental metals separately, then to complete the alloying reactions by diffusion at elevated temperature.

EXAMPLE 4

Prototype Manufactures

In one prototype, "mushroom" shaped canopies were manufactured 300 µm tall, with 170×170 µm square posts, topped by square canopies 300 to 300 µm in diameter at the base.

A 0.1 µm-thick nickel film, deposited from a modified Watts bath, adhered well to a silicon wafer. The composition of the modified Watts bath was as follows: $NiSO_4 \cdot 6H_2O$ (300 grams/liter), $NiCl_2 \cdot 6H_2O$ (45 grams/liter), boric acid (45 grams/liter), sodium lauryl sulfate (0.3–0.5 grams/liter), saccharin (0.5–1.0 grams/liter), coumarin (0.5 grams/liter), pH 2.0, temperature 55° C. The sodium lauryl sulfate acted as a surfactant, and the saccharin acted as a stress reliever to help produce fine grains. The anode was a nickel foil. High current densities of 0.1 to 0.2 A/cm$^2$, corresponding to a nickel deposition rate of 100–150 µm/hour, lowered the time required to electroplate the 490 µm tall nickel prototype structures to just four hours. Profilometric measurements of the heights of the structures indicated no more than a three µm variation in height across any one structure, and a variation not exceeding ten µm between any two structures, an acceptable range of variation. This modified Watts bath has two important advantages over the standard Watts bath in manufacturing mold inserts. First, high current densities can readily be achieved, on the order of 200 mA/cm$^2$, allowing the deposition of tall structures to be completed in a few hours. Conventional nickel plating procedures would require many hours or even days to electroplate such high structures. PMMA is hydrophilic and swells gradually in the presence of water. Stresses generated as PMMA swells in aqueous electrolytic baths could cause PMMA to delaminate from the substrate. Shorter electroplating runs help minimize this problem. A second advantage of the modified Watts bath is that a fine-grained deposit without significant impurities was produced; the grain size was often on the order of nanometers. Such fine-grained deposits have improved hardness. Measurements using a microhardness indenter (15 gram load) showed that the resulting mold insert had a Vickers hardness number (VHN) of 494, a value almost twice as high as that for nickel prepared using conventional electroplating procedures. The exceptional hardness of the deposited nickel produced a mold insert with the desired high rigidity and low wear rate.

It is important that the polymer sheet conform closely to the surface of the substrate. If the two separate, undesirable electroplating between the polymer sheet and the substrate can occur. Stresses induced by the swelling of PMMA in the electrolyte during the plating process can cause delamination. The electrodeposition rate in larger cavities can be greater than the rate in smaller cavities in structures whose cross sectional area varies considerably. Such differential deposition rates should not present major difficulties if the characteristic dimension of the structure being electroplated does not vary by more than about one order of magnitude across the structure; or if the "height" of the "wells" in the polymer sheet in which electrodeposition occurs is made taller than the "height" of the structures being formed; or if, after electrodeposition, the surfaces of the microstructures are lathed to a common height.

EXAMPLE 5

Enhancement of heat transfer

In another application of HARMs, rates of heat transfer can be augmented by covering a surface with a field of "microposts" to radiate heat instead of "micro-umbrellas" to block heat transfer. For example, using a field of microposts in the cooling passages of a turbine blade could help better cool the blade. Enhanced internal cooling with microposts may be used in lieu of, or preferably in addition to the microstructure canopy on the outside of the blade. The objects whose heat is being transferred away will generally have a surface area of at least about 1 cm², and the number of microposts used is preferably at least about 10 per cm² of surface area, more preferably at least about 5000 per cm². The preferred aspect ratio of each micropost depends on its composition, as well as the identity of the surrounding fluid, but is generally at least about 10. In this context, the "aspect ratio" of a micropost is the ratio of the distance between the proximal and distal ends of the micropost to the characteristic dimension of the micropost; where the characteristic dimension of a micropost is the diameter of the micropost in a plane perpendicular to a line between the proximal and distal ends of the micropost. Each of at least about 80% of the microposts is farther from the nearest neighboring micropost than a distance of about 20 times the characteristic dimension of the micropost.

An example is an article of manufacture comprising a heat sink to augment heat transfer between an object and the surroundings, wherein: (a) the object has a face whose surface area is at least about 1 cm²; (b) said heat sink comprises a plurality of at least about 100 microposts per cm² of surface area of the face, wherein each of said microposts has a distal end and a proximal end; (c) said proximal end of each of said microposts is connected to the face; (d) said distal end of each of said microposts is not connected to a shield, wall, or other object that inhibits heat transfer; and (e) the distance between the proximal and distal ends of each of said microposts is between about 0.05 mm and about 1.0 mm, and the aspect ratio of each of said microposts is at least about 5; whereby total heat transfer between the object and the surroundings is substantially greater than would be the heat transfer between an otherwise identical object lacking said microposts and the surroundings.

Preferably: (a) said heat sink comprises a plurality of at least about 1000 microstructures per cm² of surface area of the face; (b) the distance between the proximal and distal ends of each of said microposts is at least about 0.1 mm; and (c) each said micropost is farther from the nearest neighboring micropost than a distance of about 5 times the diameter of said micropost.

For example, consider an otherwise flat surface covered with nickel posts 20 μm in diameter and 800 μm long, with an air freestream velocity over the surface of 10 m/sec.

If the plate is flat, the heat transfer coefficient h is given by $$h=0.037 \; K/L \; (V_\infty L/v)^{0.8} Pr^{0.333}$$

Assuming that the fluid has the properties of air at room temperature, that the temperature of the plate is constant, $T_0$, and that the length of the plate is 1.0 m, then h=38 W/m²-°K. The rate of heat transfer per unit area, q, is given by $$q=(38 \; W/m^2\text{-}°K)(T_0-T_\infty)$$

where $T_\infty$ is the freestream temperature.

Calculation of heat transfer from the sheet covered with posts makes the reasonable approximation that the sheet, including the base of all the posts, has a uniform temperature, $T_0$. With this boundary condition, the heat flux through each post is given by:

$$q=(hPk/A)^{0.5} \; (T_0-T_\infty)$$

where:
- h=convection heat transfer coefficient around a post
- P=perimeter of post (πD)
- A=cross section of post (πD²/4)
- k=thermal conductivity of post The value of h is given by:

$$h=0.911 \; K/D \; V_\infty D/v)^{0.385} Pr^{0.333}$$

where:
- $V_\infty$=freestream velocity
- D=post diameter
- v=dynamic viscosity of air at 300° K
- Pr=Prandtl number of air at 300° K
- K=thermal conductivity of air at 300° K Using published values for these properties of air, the value of h is calculated as 2820 W/m²-°K. Note that this value is two orders of magnitude higher than the convective heat transfer coefficient for the flat plate without microstructures.

The heat transfer flux through each post, assuming the thermal conductivity of the nickel post is 50 W/m-°K, is given by:

$$q=(168,000 \; W/m^2\text{-}°K)(T_0-T_\infty)$$

Note that the heat transfer of a micropost is over four thousand times greater than the heat transfer of an area of flat sheet having the same size as the cross-section of the base of the post.

The overall heat transfer from a surface with microposts covering 2% of the surface area of the plate is the weighted average of the heat transfer rate from the 2% covered with posts and the 98% not covered with posts. Assuming that convective heat transfer between the area not covered with posts and the air is not substantially altered by the presence of the posts, the effective heat transfer coefficient between the surface and the air is (0.02)(168,000)+(0.98)(38)=3397 W/m²-°K, an increase of almost two orders of magnitude compared to a flat plate of the same size. This calculated ratio is probably too high, because internal resistances in the plate will limit heat transfer through each post, but it is nevertheless true that HARM posts dramatically decrease thermal resistance between a surface and the surrounding medium. In cases where the convective heat transfer coefficient between a surface and the surrounding medium is a large contributor to the total resistance to heat transfer, adding HARMs to the surface can increase heat transfer dramatically.

EXAMPLE 6

Composite Materials

In yet another application, HARMs can be used to join layers of dissimilar materials to form a composite material. HARMs can be used to bind materials together strongly that would otherwise bond weakly or not at all, allowing the production of novel composite materials. Weakness at the interface between different lamina in a laminated composite is often the limiting factor in controlling the properties of the laminate. Strong bonds between the lamina are usually desired. With prior technologies it has often been difficult to establish strong bonds between otherwise potentially useful material combinations. For example, metal-polymer and metal-ceramic bonds are often weak. However, by covering a metal sheet with HARMs, the metal sheet can be strongly joined to thin sheets of polymer or ceramic. The resulting product can be very useful, combining for example the strength and toughness of a metal with the light weight of a polymer, or the high temperature properties of many ceramics. Lamina that may otherwise bond poorly to one another can be joined more strongly with HARMs at the interface between lamina, to better physically link the lamina to one another, and to enhance chemical bonding between the layers by increasing the surface area of interaction.

Applying HARMs to the surface of one of the materials limits the degrees of freedom in which failure of the bond is likely to occur, and also greatly increases the surface area of the interface at which the two materials are joined. Thus binding may be enhanced both by mechanical linkage of the two surfaces, and by enhanced chemical bonding through increased areas of interaction.

Where HARMs are not present at the interface, the stress (normal or shear) required to separate the two sheets is the "conventional" strength (tensile or shear) of the interface. But with fields of HARMs, failure due to an applied shear stress cannot occur without shearing off the HARMs themselves; furthermore, the normal stress at which failure occurs is higher because a load-carrying component at the interface has been added, the load carried in shear along the interface with the HARMs.

This concept may be extended to physically interlocking surfaces in which one of the surfaces is covered with HARMs. Failure due to mechanical forces then cannot occur in any direction without shearing the HARMs, regardless of the strength of any interactions between the surfaces.

An example is a composite material comprising a first layer of a first substance, and a second layer of a second substance that is different from the first substance, wherein: (a) each of said layers comprises a proximal face, and the proximal faces of said first and second layers are substantially in contact with one another; (b) said proximal face of said first layer is connected to the proximal ends of each of a plurality of at least about 10 microstructures per $cm^2$ of surface area of the proximal face of said first layer, wherein each of said microstructures comprises a proximal end and a distal end; (c) the distance between the proximal and distal ends of each of said microstructures is between about 0.01 mm and about 0.5 mm, and the aspect ratio of each of said microstructures is at least about 5; and (d) the shape of said proximal face of said second layer is substantially complementary to said microstructures; whereby the adhesion between said first and second layers is substantially greater than would be the adhesion between two otherwise identical layers lacking said microstructures.

Preferably: (a) said proximal face of said first layer is connected to the proximal ends of each of a plurality of at least about 100 microstructures per $cm^2$ of surface area of the proximal face of said first layer; (b) the distance between the proximal and distal ends of each of said microstructures is between about 0.1 mm and about 0.5 mm, and the aspect ratio of each of said microstructures is at least about 10; and (c) each of said microstructures is closer to the nearest neighboring microstructure than a distance of about 5 times the width of said microstructure.

EXAMPLE 7

Acoustic absorbers

Yet another application of HARMs is as acoustic absorbers, to reduce the amplitude of sound transmitted through a surface. Sound waves impinging on one side of a surface cause the surface to vibrate; the vibrating surface then transmits sound energy to its surroundings on the opposite side; air is usually the medium of interest. The human ear can detect sound in an audible range from about 20 to about 15,000 Hertz. At a given frequency, the amplitude of sound increases with the amplitude of the vibration of the surface. Covering the surface with appropriate microstructures can reduce the amplitude of transmitted vibrations, and can therefore reduce the amplitude of the sound transmitted to the surrounding medium. The natural frequency of the microstructures is a function of their geometry and composition. The geometry and composition are chosen so that the natural frequency is below that of the vibrations of interest. They will thus oscillate out of phase with those vibrations, and the amplitude of the vibrations at the tips of the microstructures will therefore be less than the amplitude of the vibrations of the underlying surface. Because the amplitude of displacement of the tips of the microstructures is small, the sound transmitted across the surface is greatly reduced, because it is primarily at those tips where sound energy is transmitted to the adjacent air.

Consider, for example, two flat sheets, one without a layer of HARMs and one with a layer of HARMs to be described below. In both cases a forcing function on one side causes the sheets to vibrate at 5000 Hz. The sheet without microstructures will transmit sound of frequency 5000 Hz to the surrounding air at a particular amplitude.

The microstructures covering the other sheet, however, have a natural frequency below 5000 Hz, and will therefore absorb much of the 5000 Hz energy. For example, a nickel cantilever microstructure with a natural frequency of 2400 Hz may be made with a cylindrical "post" capped with a cylindrical "weight," the two cylinders having collinear axes. The post is 500 $\mu$m tall and 15 $\mu$m in diameter, and the weight is 200 $\mu$m tall and 200 $\mu$m in diameter. The oscillations of the microstructures with a 2400 Hz natural frequency are out of phase with the 5000 Hz oscillations of the sheet, and will transmit less than 30% of the 5000 Hz sound energy impinging on the sheet. The remaining energy is dissipated as heat.

The axes of the cylinders are preferably at an angle to a direction normal to the surface of the sheet, better permitting them to absorb vibrations normal to the surface. (Such "tilted" microstructures may readily be made by adjusting the angle of incidence of x-rays during exposure of the photoresist.) Nearest-neighbor microstructures are preferably spaced within about 2 diameters of one another (2 diameters of the larger "weights," that is, e.g., within 400 $\mu$m of one another in the above example.) An example is an article of manufacture comprising an acoustic barrier to reduce transmission of sound having a frequency above a characteristic frequency through an object, wherein: (a) the object has a first face whose surface area is at least about 10 $cm^2$; (b) said acoustic barrier comprises a plurality of at least about 50 microstructures per $cm^2$ of surface area of the first face, wherein said microstructures are connected to the first face; (c) each of said microstructures has a natural vibrational frequency below the characteristic frequency; whereby transmission of sound above the characteristic frequency through the object is substantially less than would be the transmission of sound through an otherwise identical object lacking said acoustic barrier. Preferably, said acoustic barrier comprises a plurality of at least about 500 microstructures per $cm^2$ of surface area of the first face.

Miscellaneous

Methods of fabricating microstructures having a high aspect ratio are disclosed in Y. Vladimirsky et al., "Microstructures and Methods for Manufacturing Microstructures," international patent application publication number WO 96/07954, international publication date 14 Mar. 1996, the entire disclosure of which is incorporated by reference. The entire disclosures of all other references cited in this specification are also hereby incorporated by reference in their entirety. In the event of an otherwise irresolvable conflict, however, the present specification shall control.

I claim:

1. A process for producing microstructures on a metal surface, comprising the steps of:
   (a) heat-shrinking a non-conductive polymer sheet onto the metal surface; wherein there is no gap or there is a negligible gap between the metal surface and the non-conductive sheet; wherein the non-conductive sheet contains a plurality of holes; wherein the holes are formed in the non-conductive sheet at a time when the non-conductive sheet is not in contact with the metal surface; and wherein the non-conductive sheet is not chemically bonded to the metal surface; and
   (b) electroplating metal onto the metal surface with the holes of the non-conductive sheet;
whereby metal microstructures are produced on the metal surface.

2. The process of claim 1, wherein the metal surface is substantially non-planar.

3. The process of claim 1, wherein the polymer sheet comprises poly (methyl methacrylate).

4. The process of claim 1, wherein at least some of the holes in the nonconductive sheet have an aspect ratio greater than about 5.

5. The process of claim 1, additionally comprising the step of removing the non conductive sheet from the metal surface after said electroplating step.

6. The process of claim 1, wherein the non-conductive sheet is a ceramic.

7. A process for producing microstructures on a metal surface, comprising the steps of:
   (a) bonding a polymer sheet to the metal surface with a chemical bonding agent; wherein there is no gap or there is a negligible gap between the metal surface and the polymer sheet; wherein the polymer sheet contains an exposed, developable, but undeveloped latent image of a plurality of holes or structures; wherein the latent image is formed in the polymer sheet at a time when the polymer sheet is not in contact with the metal surface;
   (b) developing the latent image to produce a plurality of holes or structures in the polymer sheet, without substantially affecting the chemical bonding between the metal surface and the polymer sheet;
   (c) removing the chemical bonding agent from the metal surface within the holes in the polymer sheet, without substantially affecting the chemical bonding between the metal surface and the portions of the polymer sheet that do not correspond to the developed holes or structures; and
   (d) electroplating metal onto the metal surface within the holes of the polymer sheet;
whereby metal microstructures are produced on the metal surface.

8. The process of claim 7, wherein the metal surface is substantially non-planar.

9. The process of claim 8, additionally comprising the step of heat-shrinking the polymer sheet onto the metal surface.

10. The process of claim 7, wherein the polymer sheet comprises poly (methyl methacrylate), and wherein the latent image is formed by selective x-ray irradiation of the polymer sheet.

11. The process of claim 7, wherein at least some of the holes or structures in the developed image are holes having an aspect ratio greater than about 5.

12. The process of claim 7, additionally comprising the step of removing the polymer sheet from the metal surface.

13. A process for producing microstructures on a metal surface, comprising the steps of:
   (a) bonding a non-conductive sheet to the metal surface with a chemical bonding agent; wherein there is no gap or there is a negligible gap between the metal surface and the non-conductive sheet; wherein portions of the non-conductive sheet are substantially thinner in areas corresponding to a plurality of holes or structures;
   (b) etching the non-conductive sheet to produce the plurality of holes or structures in the sheet in the substantially thinner areas, without substantially affecting the chemical bonding between the metal surface and the portions of the sheet that do not correspond to the substantially thinner areas;
   (c) removing the chemical bonding agent from the metal surface within the etched holes in the sheet, without substantially affecting the chemical bonding between the metal surface and the portions of the sheet that do not correspond to the holes; and
   (d) electroplating metal onto the metal surface within the holes in the sheet;
whereby metal microstructures are produced on the metal surface.

14. The process of claim 13, wherein the metal surface is substantially non-planar.

15. The process of claim 13, wherein the non-conductive sheet comprises a polymer.

16. The process of claim 15, wherein the polymer sheet comprises poly (methyl methacrylate).

17. The process of claim 13, wherein at least some of the holes in the non-conductive sheet have an aspect ratio greater than about 5.

18. The process of claim 13, additionally comprising the step of removing the non-conductive sheet from the metal surface after said electroplating step.

19. The process of claim 13, wherein the nonconductive sheet is a ceramic.

20. The process of claim 13, wherein the non-conductive sheet is formed by molding.

* * * * *